United States Patent
Li

(10) Patent No.: US 10,943,912 B2
(45) Date of Patent: Mar. 9, 2021

(54) METHOD FOR FABRICATING SEMICONDUCTOR DEVICE

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/403,251

(22) Filed: May 3, 2019

(65) Prior Publication Data
US 2019/0259766 A1    Aug. 22, 2019

Related U.S. Application Data

(62) Division of application No. 15/856,323, filed on Dec. 28, 2017, now Pat. No. 10,332,895.

(30) Foreign Application Priority Data

Dec. 29, 2016 (CN) .......................... 201611248887.1

(51) Int. Cl.
*H01L 27/11* (2006.01)
*H01L 21/8238* (2006.01)
(Continued)

(52) U.S. Cl.
CPC .... *H01L 27/1104* (2013.01); *H01L 21/82385* (2013.01); *H01L 21/823842* (2013.01);
(Continued)

(58) Field of Classification Search
CPC ..... H01L 21/823821; H01L 21/823842; H01L 21/82385; H01L 27/0207; H01L 27/0924; H01L 27/1104; H01L 29/42376
See application file for complete search history.

(56) References Cited

U.S. PATENT DOCUMENTS 5,585,659 A * 12/1996 Kobayashi ...... H01L 21/823842
257/371
6,034,401 A   3/2000 Hsia et al.
(Continued)

*Primary Examiner* — Mohammed Shamsuzzaman
(74) *Attorney, Agent, or Firm* — Anova Law Group, PLLC

(57) ABSTRACT

A semiconductor device includes a base substrate including an NMOS region and a PMOS region. The PMOS region includes a first P-type region and a second P-type region. The semiconductor device also includes an interlayer dielectric layer, a gate structure formed through the interlayer dielectric layer and including an N-type region gate structure formed in the NMOS region, a first gate structure formed in the first P-type region and connected to the N-type region gate structure, and a second gate structure formed in the second P-type region and connected to the first gate structure. The direction from the N-type region gate structure to the second gate structure is an extending direction of the gate structure, and along a direction perpendicular to the extending direction of the gate structure, the width of the first gate structure is larger than the width of the second gate structure.

17 Claims, 7 Drawing Sheets

(51) Int. Cl.
  *H01L 27/02* (2006.01)
  *H01L 27/092* (2006.01)
  *H01L 29/423* (2006.01)

(52) U.S. Cl.
  CPC .. *H01L 27/0207* (2013.01); *H01L 21/823821* (2013.01); *H01L 27/0924* (2013.01); *H01L 29/42376* (2013.01)

(56) References Cited

U.S. PATENT DOCUMENTS

| | | | |
|---|---|---|---|
| 9,524,965 B2* | 12/2016 | Ho | H01L 21/76802 |
| 2009/0309162 A1 | 12/2009 | Baumgartner et al. | |
| 2014/0027857 A1* | 1/2014 | Yin | H01L 21/823842 |
| | | | 257/368 |
| 2014/0252487 A1* | 9/2014 | Stephens | H01L 27/092 |
| | | | 257/368 |
| 2014/0317581 A1* | 10/2014 | Chuang | H01L 21/0274 |
| | | | 716/53 |
| 2014/0374840 A1* | 12/2014 | Lee | H01L 21/823821 |
| | | | 257/401 |
| 2015/0054085 A1* | 2/2015 | Lin | H01L 21/823842 |
| | | | 257/369 |
| 2015/0069532 A1* | 3/2015 | Xie | H01L 29/66795 |
| | | | 257/410 |
| 2015/0214367 A1* | 7/2015 | Chang | H01L 21/76802 |
| | | | 257/401 |
| 2016/0111425 A1* | 4/2016 | Chen | H01L 29/66545 |
| | | | 257/369 |
| 2016/0190271 A1* | 6/2016 | You | H01L 27/0207 |
| | | | 257/401 |
| 2016/0293726 A1* | 10/2016 | Huang | H01L 29/66545 |
| 2018/0090492 A1* | 3/2018 | Ranjan | H01L 23/5283 |
| 2018/0138168 A1* | 5/2018 | Wang | H01L 21/823814 |
| 2018/0151376 A1* | 5/2018 | Choi | H01L 21/32139 |
| 2018/0158957 A1* | 6/2018 | Rachmady | H01L 29/66522 |

* cited by examiner

METHOD FOR FABRICATING SEMICONDUCTOR DEVICE

CROSS-REFERENCES TO RELATED APPLICATIONS

This application is a divisional of U.S. patent application Ser. No. 15/856,323, filed on Dec. 28, 2017 which claims the priority of Chinese Patent Application No. CN201611248887.1, filed on Dec. 29, 2016, the entire content of all of which is incorporated herein by reference.

FIELD OF THE DISCLOSURE

The present disclosure generally relates to the field of semiconductor fabrication technology and, more particularly, relates to methods for fabricating semiconductor devices.

BACKGROUND

The major semiconductor devices for integrated circuits (ICs), especially in very-large scale integrated (VLSI) circuits, include metal-oxide-semiconductor field-effect transistors (MOSFETs). With the continuous development of IC manufacturing technology, the technical nodes of semiconductor devices continue to decrease, and the geometrical dimensions of semiconductor devices become smaller and smaller following the Moore's law. When the reduction of the dimensions of semiconductor devices reaches a certain level, various secondary effects due to approaching to the physical limits of semiconductor devices begin to emerge, and thus further scaling down the feature size of semiconductor devices becomes more and more difficult. Among all the problems in the field of semiconductor manufacturing, the most challenging one is to solve the large leakage current issue in semiconductor devices. Specifically, a large leakage current in a semiconductor device is mainly caused by the continuous decrease in the thickness of the conventional dielectric layer in the semiconductor devices.

Conventional solutions include use of a high-k material to replace the commonly-used $SiO_2$ as the gate dielectric material and also use a metal material as the gate electrode material to avoid Fermi level pinning between the high-k material and the conventional gate electrode material and also avoid boron penetration. Such a gate structure using a high-k material to form the gate dielectric layer and a metal material to form the gate electrode is known as a high-k metal gate (HKMG). The introduction of the HKMG reduces the leakage current in semiconductor structures.

Although the introduction of the HKMG may have improved the electrical performance of semiconductor devices to a certain extent, the electrical performance of existing semiconductor devices may still need to be improved. The disclosed semiconductor structures and fabrication methods thereof are directed to solve one or more problems set forth above and other problems in the art.

BRIEF SUMMARY OF THE DISCLOSURE

One aspect of the present disclosure provides a semiconductor device. The semiconductor device includes a base substrate. The base substrate includes an N-type metal-oxide-semiconductor (NMOS) region and a P-type metal-oxide-semiconductor (PMOS) region adjacent to the NMOS region. The PMOS region includes a first P-type region adjacent to the NMOS region and a second P-type region adjacent to the first P-type region. An N-type device is formed in the NMOS region, and a P-type device is formed in the PMOS region. The semiconductor device also includes an interlayer dielectric layer formed on the base substrate, a gate structure formed through the interlayer dielectric layer and including an N-type region gate structure formed on the base substrate in the NMOS region, a first gate structure formed on the substrate in the first P-type region and connected to the N-type region gate structure, and a second gate structure formed on the substrate in the second P-type region and connected to the first gate structure. The direction from the N-type region gate structure to the second gate structure is an extending direction of the gate structure, and along a direction perpendicular to the extending direction of the gate structure, the width of the first gate structure is larger than the width of the second gate structure.

Another aspect of the present disclosure provides a method for fabricating a semiconductor device. The method includes forming an interlayer dielectric layer on a base substrate. The base substrate includes an NMOS region and a PMOS region adjacent to the NMOS region. The PMOS region includes a first P-type region adjacent to the NMOS region and a second P-type region adjacent to the first P-type region. The NMOS region is used to form an N-type device, and the PMOS region is used to form a P-type device. The method also includes forming an N-type region opening in the NMOS region through the interlayer dielectric layer, a first opening in the first P-type region through the interlayer dielectric layer and connected to the N-type region opening, and a second opening in the second P-type region through the interlayer dielectric layer and connected to the first P-type opening. The direction from the N-type region opening to the second opening is an extending direction of a subsequently-formed gate structure, and along a direction perpendicular to the extending direction of the gate structure, the width of the first opening is larger than the width of the second opening.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the invention, which are illustrated in the accompanying drawings. Wherever possible, the same reference numbers will be used throughout the drawings to refer to the same or like parts.

In semiconductor devices, when the width of the gate structure of an N-type metal-oxide-semiconductor (NMOS) device and the width of the gate structure of an adjacent P-type metal-oxide-semiconductor (PMOS) device are identical in the channel length direction, the response speed of the PMOS device may be slow, and thus the alternating current (AC) performance of the semiconductor device may be affected. Specifically, when the channel length of the semiconductor device continuously decreases, the above problem may become more and more severe.

Figure 1:
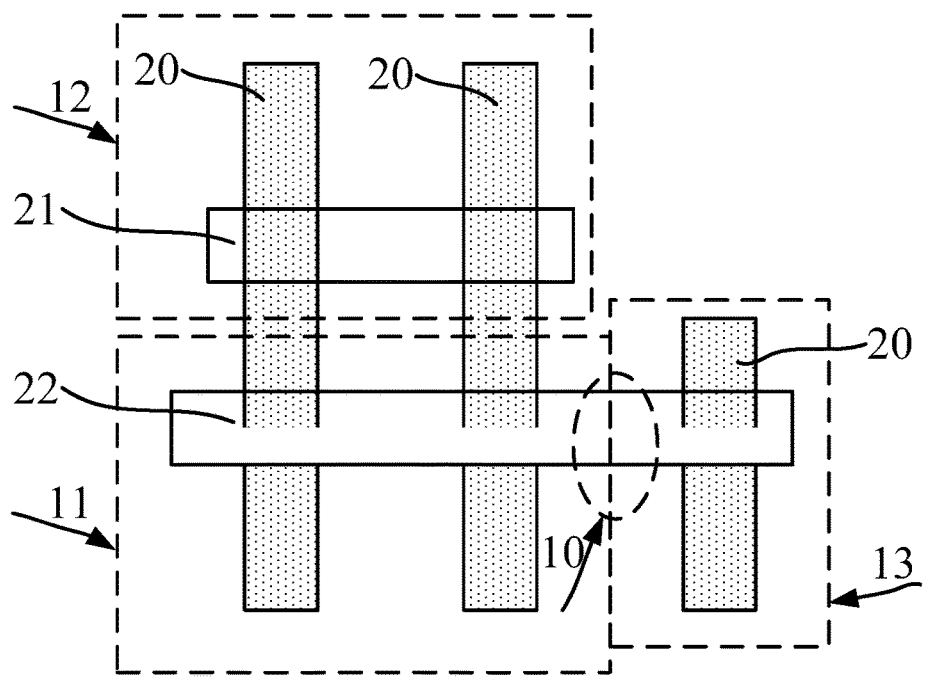
FIGS. 1-2 illustrate schematic structural views of a semiconductor device.
Figure 2:
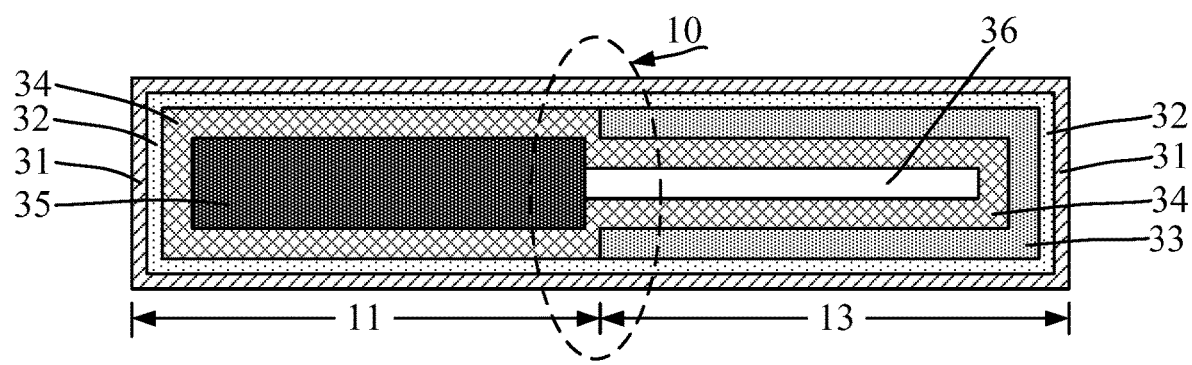

FIGS. 1-2 illustrate schematic views of a SRAM device. FIG. 1 shows a schematic top view of the SRAM device and FIG. 2 shows an enlarged top view of the gate structure shown in FIG. 1.

Referring to FIG. 1, the SRAM device includes a pull down (PD) transistor region 11, a pass gate (PG) transistor region 12, and a pull up (PU) transistor region 13. The PD transistor region 11 and the PG transistor region 12 are both NMOS regions. The PU transistor region 13 is a PMOS region. The PD transistor region 11 and the PU transistor region 13 are next to each other.

The SRAM device also includes a plurality of discrete fin structures 20. The PD transistor region 11 and the PG transistor region 12 share two fin structures 20. In addition, a fin structure 20 is formed entirely in the PU transistor region 13. That is, the fin structure 20 formed in the PU transistor region 13 is separated from other regions.

The SRAM device further includes a first gate structure 21 formed across the fin structure 20 in the PG transistor region 12.

Moreover, the SRAM device includes a second gate structure 22 formed across the fin structures 20 formed in the PD transistor region 11 and also across the fin structure 20 formed in the PU transistor region 13. The PD transistor region 11 and the PU transistor region 13 share a same second gate structure 22.

Referring to FIG. 2, the second gate structure 22 includes a gate dielectric layer 31 formed in the PD transistor region 11 and the PU transistor region 13, a barrier layer 32 formed on the gate dielectric layer 31, a P-type work function (WF) layer 33 formed on the barrier layer 32 in the PU transistor region 13, an N-type WF layer 34 formed on the barrier layer 32 in the PD transistor region 11 and also on the P-type WF layer 33 in the PU transistor region 13, and a gate electrode layer 35 filling up an opening formed in the PD transistor region 11 and surrounded by the N-type WF layer 34.

Because the number of film layers in the second gate structure 22 formed in the PU transistor region 13 is larger than the number of film layers in the second gate structure 22 formed in the PD transistor region 11, the dimension of the opening formed in the PU transistor region 13 and surrounded by the N-type WF layer 34 is substantially smaller than the dimension of the opening formed in the PD transistor region 11 and surrounded by the N-type WF layer 34. Specifically, the dimension of an opening surrounded by the N-type WF layer 34 refers to a measure of the opening in the length direction of the channel. Therefore, during the process to fill in the gate electrode layer 35, the gate electrode layer 35 is easily filled into the opening formed in the PD transistor region 11 and surrounded by the N-type WF layer 34. In addition, it may be difficult to fill the gate electrode layer 35 into the opening formed in the PU transistor region 13 and surrounded by the N-type WF layer 34.

As such, at the boundary region 10 between the PD transistor region 11 and PU transistor region 13, the N-type WF layer 34 formed in the PU transistor region may not be covered by the gate electrode layer 35, and a gap 36 may be formed in the second gate structure 22 in the PU transistor region to expose the N-type WF layer 34. Therefore, the second gate structure 22 formed in the PU transistor region 13 at the boundary region 10 may have a relatively high resistance, causing a slow response speed of the PU transistor formed in the PU transistor region 13. Therefore, the electrical performance of the SRAM device may be affected.

Further, when the portion of the N-type WF layer 34 formed in the PU transistor region 13 at the boundary region 10 is also covered by the gate electrode layer 35, the resistance of the second gate structure 22 of the PU transistor may be reduced. Therefore, the response speed of the PU transistor may be improved.

The present disclosure provides a semiconductor device and fabrication method thereof to improve the response speed of PMOS transistors in semiconductor devices, and thus improve the electrical performance of the semiconductor devices.

Figure 3:
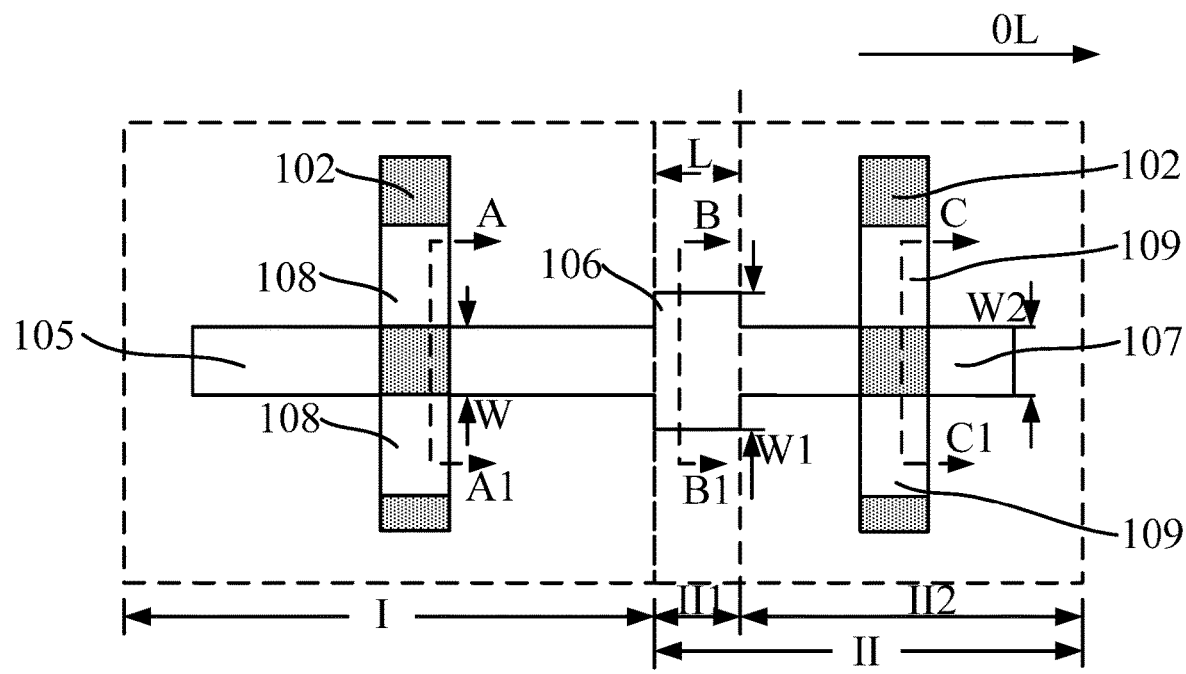
FIGS. 3-5 illustrate schematic structural views of an exemplary semiconductor device consistent with various embodiments of the present disclosure.
Figure 4:
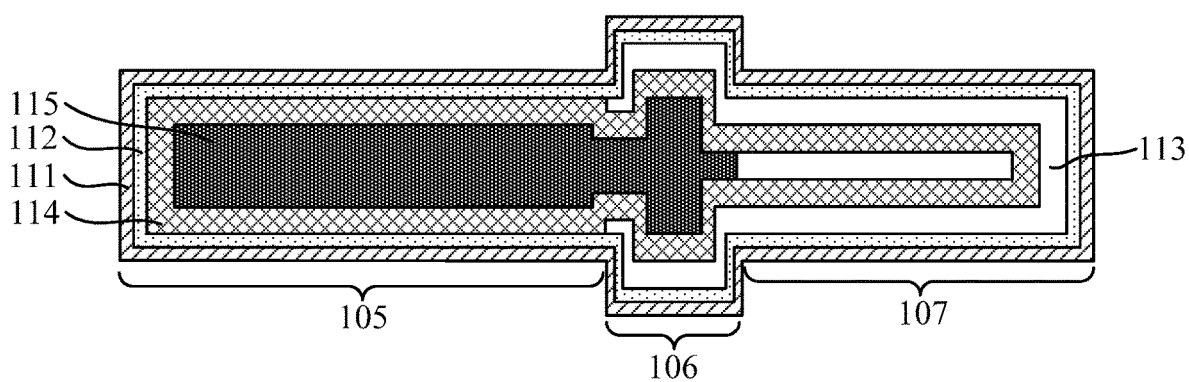
Figure 5:
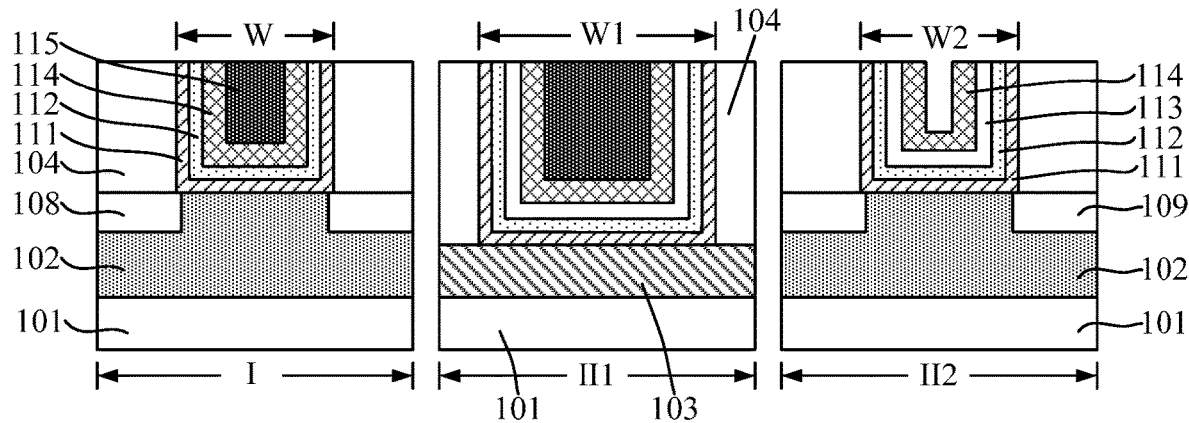

FIGS. 3-5 illustrate schematic structural views of an exemplary semiconductor device consistent with various embodiments of the present disclosure. Specifically, FIG. 3 shows a schematic top view of the semiconductor device, FIG. 4 shows an enlarged top view of the gate structure shown in FIG. 3, the left panel (region I) of FIG. 5 shows a schematic cross-section view of the semiconductor structure shown in FIG. 3 along an AA1 line, the center panel (region II1) of FIG. 5 shows a schematic cross-section view of the semiconductor structure shown in FIG. 3 along a BB1 line, and the right panel (region II2) of FIG. 5 shows a schematic cross-section view of the semiconductor structure shown in FIG. 3 along a CC1 line.

Referring to FIGS. 3-5, the semiconductor device may include a base substrate and an interlayer dielectric layer 104 formed on the base substrate. The base substrate may include an NMOS region I and a PMOS region II adjacent to the NMOS region I. The NMOS region I may include an N-type device and the PMOS region II may include a P-type device. The PMOS region II may include a first P-type region II1 adjacent to the NMOS region I and a second P-type region II2 adjacent to the first P-type region II1.

The semiconductor device may include a gate structure formed through the interlayer dielectric layer 104. The gate structure may include an N-type region gate structure 105 formed on the base substrate in the NMOS region I, a first gate structure 106 formed on the base substrate in the first P-type region II1 and connected to the N-type region gate structure 105, a second gate structure 107 formed on the base substrate in the second P-type region II2 and connected to the first gate structure 106. The direction from the N-type region gate structure 105 to the second gate structure 107 may be the extending direction 0L of the gate structure. Moreover, along a direction perpendicular to the extending direction 0L of the gate structure, the width W1 of the first gate structure 106 may be larger than the width W2 of the second gate structure 107.

The semiconductor device may also include an N-type source/drain doped region 108 formed in the base substrate on each side of the N-type gate structure 105, and a P-type source/drain doped region 109 formed in the base substrate on each side of the second gate structure 107.

In one embodiment, the gate structure may further include a gate dielectric layer 111 formed on the base substrate of the NMOS region I and the PMOS region II and also on the sidewall surfaces of the interlayer dielectric layer 104, a P-type WF layer 113 formed on the gate dielectric layer 111 in the first P-type region II1 and the second P-type region II2, an N-type WF layer 114 formed on the gate dielectric layer in the NMOS region I and also on the P-type WF layer 113, and a gate electrode layer 115 formed on the N-type WF layer 114 in the NMOS region I and also on the N-type WF layer 114 in the first P-type region II1.

In the following, a fin field-effect transistor (Fin-FET) device is described as an example to illustrate the disclosed semiconductor device, although any suitable semiconductor devices may be formed or included according to various embodiments of the present disclosure. The base substrate may include a substrate 101 and a plurality of fin structures 102 protruding from the substrate 101. The base substrate may also include an isolation structure 103 formed on the substrate 101 between neighboring fin structures 102. The isolation structure 103 may cover a portion of the sidewall surfaces of each fin structure 102, and the top surface of the isolation structure 103 may be lower than the top surfaces of the fin structures 102.

The plurality of fin structures 102 may be formed in both the NMOS region I and the second P-type region II2. In addition, the plurality of fin structures 102 may be arranged in parallel to each other.

Accordingly, the gate structure may be formed on the isolation structure 103 and across the plurality of fin structures 102. The gate structure may cover a portion of the top and sidewall surfaces of each fin structure 102. Specifically, the N-type region gate structure 105 may be formed on the isolation structure 103 of the NMOS region I and across the fin structure 102 in the NMOS region I, the first gate structure 106 may be formed on the isolation structure 103 of the first P-type region II1, the second gate structure 107 may be formed on the isolation structure 103 in the second P-type region II2 and across the fin structure 102 in the second P-type region II2.

The substrate 101 may be made of silicon, germanium, SiGe, SiC, GaAs, InAs, or any other appropriate semiconductor material. The substrate 101 may also be made of silicon on insulator (SOI), germanium on insulator (GOI), or any other composite semiconductor structure. The plurality of fin structures 102 may be made of silicon, germanium, SiGe, SiC, GaAs, InAs, or any other appropriate semiconductor material. In one embodiment, the substrate 101 is made of silicon and the fin structures 102 are also made of silicon.

The isolation structure 103 may be made of $SiO_x$, $SiN_x$, SiON, or any other appropriate material. In one embodiment, the isolation structure 103 is made of $SiO_x$.

In other embodiments, the semiconductor device may also be a planar device, and accordingly, the base substrate may be a planar substrate.

The interlayer dielectric layer 104 may be made of $SiO_x$, $SiN_x$, and/or SiON. The interlayer dielectric layer 104 may also be made of a low-k dielectric material. Specifically, the low-k dielectric material may refer to a material with a relative dielectric constant smaller than the relative dielectric constant of $SiO_2$. In one embodiment, the interlayer dielectric layer 104 is made of $SiO_x$.

In one embodiment, the top surface of the interlayer dielectric layer 104 may be leveled with the top surfaces of the gate structure. In other embodiments, the top surface of the interlayer dielectric layer 104 may be lower than the top surface of the gate structure.

The extending direction 0L of the gate structure may be perpendicular to the channel length direction. In one embodiment, a direction from the N-type source/drain doped region 108 on one side of the N-type region gate structure 105 to the N-type source/drain doped region 108 on the other side of the N-type region gate structure 105 may be perpendicular to the extending direction 0L of the gate structure. Moreover, a direction from the P-type source/drain doped region 109 on one side of the second gate structure 107 to the P-type source/drain doped region 109 on the other side of the second gate structure 107 may be perpendicular to the extending direction 0L of the gate structure.

The N-type source/drain doped regions 108 may be used as the source and the drain of the N-type device, and the P-type source/drain doped regions 109 may be used as the source and the drain of the P-type device. In one embodiment, the N-type source/drain doped regions 108 may be formed in the fin structure 102 on the two opposite sides of the N-type region gate structure 105, and the P-type source/drain doped regions 109 may be formed in the fin structure on the two opposite sides of the second gate structure 107.

In one embodiment, in a direction perpendicular to the extending direction of the gate structure, the width of the N-type region gate structure 105 may remain a constant value.

In order to meet the performance requirements of the semiconductor device, a distance between the two N-type source/drain doped regions 108 on the opposite sides of the N-type region gate structure 105 may be a first distance, a distance between the two P-type source/drain doped regions 109 on the opposite sides of the second gate structure 107 may be a second distance, and the second distance may be equal to the first distance. Therefore, in one embodiment, the width of the N-type region gate structure 105 between the two neighboring N-type source/drain doped regions 108 may be equal to the width of the second gate structure 107 between the two neighboring P-type source/drain doped regions 109. That is, in one embodiment, along the direction perpendicular to the extending direction 0L of the gate structure, the width W of the N-type region gate structure 105 may be equal to the width W2 of the second gate structure 107.

In one embodiment, the first gate structure 106 may be adjacent to the N-type region gate structure 105. Along the direction perpendicular to the extending direction 0L of the gate structure, the width W2 of the second gate structure 107 may be actually used to control the channel length of the P-type device. In addition, along the direction perpendicular to the extending direction 0L of the gate structure, the width W of the N-type region gate structure 105 may be actually used to control the channel length of the N-type device.

In one embodiment, the gate dielectric layer may have a multiple-layer structure including an interfacial layer (not shown) and a high-k dielectric layer (not shown) formed on the interfacial layer. The interfacial layer may be made of $SiO_x$ and/or SiON, and the high-k dielectric layer may be made of a high-k dielectric material. The high-k dielectric material may refer to a material with a relative dielectric constant greater than the relative dielectric constant of $SiO_2$. In one embodiment, the high-k dielectric layer is made of $HfO_2$. In other embodiments, the high-k dielectric layer may be made of HfSiO, HfSiON, HfTaO, HfTiO, HfZrO, $ZrO_2$, or $Al_2O_3$.

In some other embodiments, the gate dielectric layer may also have a single-layer structure including a high-k dielectric layer.

In one embodiment, in order to provide protection for the gate dielectric layer 111 and prevent undesired ion diffusion into the gate dielectric layer 111, the semiconductor device may also include a barrier layer 112 formed on the gate dielectric layer in the NMOS region I, the first P-type region II1, and the second P-type region II2. Accordingly, the P-type WF layer 113 may be formed on the barrier layer 112 in the first P-type region II1 and the second P-type region II2.

In one embodiment, the barrier layer 112 may be made of TiN, and the thickness of the barrier layer 112 may be in a range of approximately 5 Å to 30 Å. In other embodiments, the barrier layer may be made of TaN.

The P-type WF layer 113 may be formed in the PMOS region II and may be used to adjust the threshold voltage of the P-type device formed in the PMOS region II. The P-type WF layer 113 may be made of a material with a WF value in a range of approximately 5.1 eV to 5.5 eV, such as 5.2 eV, 5.3 eV, 5.4 eV, etc. The P-type WF layer 113 may be made of one or more of Ta, TiN, TaN, TaSiN, and TiSiN. In one embodiment, the P-type WF layer 113 is made of TiN, and the thickness of the P-type WF layer 113 is in a range of approximately 10 Å to 30 Å.

Further, in order to avoid undesired effect on the threshold voltage of the N-type device caused by the P-type WF layer 113, the P-type WF layer 113 may only be formed in the PMOS region II.

The N-type WF layer 114 may be used to adjust the threshold voltage of the N-type device. The N-type WF layer 114 may be made of a material with a WF value in a range of approximately 3.9 eV to 4.5 eV, such as 4.0 eV, 4.1 eV, 4.3 eV, etc. The N-type WF layer 114 may be made of one or more of TiAl, TiAlC, TaAlN, TiAlN, TaCN, and AlN. In one embodiment, the N-type WF layer 114 is made of TiAl, and the thickness of the N-type WF layer 114 is in a range of approximately 20 Å to 70 Å.

The N-type WF layer 114 may have relatively small effect on the threshold voltage of the P-type device. Therefore, in order to reduce the fabrication process for the semiconductor device, the N-type WF layer 114 may be formed not only in the NMOS region I, but also in the PMOS region II.

Therefore, the N-type region gate structure 105 may include the gate dielectric layer 111, the barrier layer 112, and the N-type WF layer 114 formed in the NMOS region I, the first gate structure 106 may include the gate dielectric layer 111, the barrier layer 112, the P-type WF layer 113, and the N-type WF layer 114 formed in the first P-type region II1, and the second gate structure 107 may include the gate dielectric layer 111, the barrier layer 112, the P-type WF layer 113, and the N-type WF layer 114 formed in the second P-type region II2.

The gate electrode layer 115 may be made of Cu, Al, W, or any other appropriate material. The gate electrode layer 115 may be used to electrically connect the N-type gate structure 105, the first gate structure 106, and the second gate structure 107 to external devices or circuits.

The first gate structure 106 together with the second gate structure 107 may form the P-type region gate structure for the P-type device.

Because along the direction perpendicular to the extending direction 0L of the gate structure, the width W2 of the second gate structure 107 is equal to the width W of the N-type region gate structure 105, the space that the second gate structure 107 is able to provide for the gate electrode layer 115 may be smaller than the space that the N-type region gate structure 105 is able to provide for the gate electrode layer 115. Therefore, the space in the second gate structure 107 occupied by the gate electrode layer 115 may be smaller than the space in the N-type region gate structure 105 occupied by the gate electrode layer 115.

Further, along the direction perpendicular to the extending direction 0L of the gate structure, the width W1 of the first gate structure 106 is greater than the width W2 of the second gate structure 107. Therefore, the space that the first gate structure 106 is able to provide for the gate electrode layer 115 may be larger than the space that the second gate structure 107 is able to provide for the gate electrode layer 115. The gate electrode layer 115 may be able to fill the opening surrounded by the N-type WF layer 114 in the first P-type region II1. As such, the gate electrode layer 115 may be formed not only on the N-type WF layer 114 in the NMOS region I, but also on the N-type WF layer 114 in the first P-type region II1.

In one embodiment, the top surface of the gate electrode layer 115 may be leveled with the top surface of the N-type WF layer formed on the sidewall surfaces of the interlayer dielectric layer 104 in the NMOS region I. That is, the gate electrode layer 115 may also be regarded as filling up the opening formed in the NMOS region I and surrounded by the N-type WF layer 114. In one embodiment, the gate electrode layer 115 in the NMOS region I may fill up the opening formed in the NMOS region I and surrounded by the N-type WF layer 114. In other embodiments, the gate electrode layer formed in the NMOS region may include a gap. That is, the gate electrode layer may not completely fill the opening in the NMOS region.

In one embodiment, the top surface of the gate electrode layer may also be leveled with the top surface of the N-type WF layer formed on the sidewall surfaces of the interlayer dielectric layer 104 in the first P-type region II1. That is, the gate electrode layer 115 may also be regarded as filling up the opening formed in the first P-type region II1 and surrounded by the N-type WF layer 114. Therefore, the gate electrode layer 115 in the first P-type region II1 may fill up the opening formed in the first P-type region II1 and surrounded by the N-type WF layer 114. In other embodiments, the gate electrode layer formed in the first P-type region II1 may include a gap. That is, the gate electrode layer may not completely fill the opening in the NMOS region.

The gate electrode layer 115 may also be formed on the N-type WF layer 114 in the second P-type region II2.

In one embodiment, along the direction perpendicular to the extending direction 0L of the gate structure, the width W1 of the first gate structure is larger than the width W of the N-type region gate structure 105, and the width W of the N-type region gate structure 105 is equal to the width W2 of the second gate structure 107.

Along the direction perpendicular to the extending direction 0L of the gate structure, the difference between the width W1 of the first gate structure 106 and the width W2 of the second gate structure 107 may not be too small or too large. When the difference between the width W1 of the first gate structure 106 and the width W2 of the second gate structure 107 is too small, the space that the second gate structure 107 provides for the gate electrode layer 115 may still be small, which is not conducive to filling in the gate electrode layer 115 in the first P-type region II1. However, when the difference between the width W1 of the first gate structure 106 and the width W2 of the second gate structure 107 is too large, the space occupied by the P-type gate structure may be overly large, which is not conducive to miniaturization and micromation of devices.

Therefore, in one embodiment, along the direction perpendicular to the extending direction of the gate structure, the difference between the width W1 of the first gate structure 106 and the width W2 of the second gate structure 107 may be in a range of approximately 1 nm to 5 nm.

Moreover, along the extending direction 0L of the gate structure, the length L of the first gate structure 106 may not be too large or too small. When the length L of the first gate structure 106 is too small, the space that the first gate structure 106 provides for the gate electrode layer 115 may be too small, which is not conducive to filling in the gate electrode layer 115 in the first P-type region II1. However, when the length L of the first gate structure 106 is too large, the first gate structure may affect the channel length in the P-type device.

Therefore, in one embodiment, along the extending direction 0L of the gate structure, the length L of the first gate structure 106 may be in a range of approximately 3 nm to 5 nm.

In one embodiment, in a plane parallel to the surface of the base substrate, the cross section of the gate structure may have a cross shape. Specifically, the N-type region gate structure 105 and the second gate structure 107 may together form a horizontal bar of the cross, and the first gate structure 106 may form a vertical bar of the cross.

Because the gate electrode layer 115 is formed in the first gate structure 106 of the P-type gate structure, the presence of the gate electrode layer 115 may help reduce the resistance of the P-type region gate structure. Specifically, the presence of the gate electrode layer 115 in the first P-type region II1 may be conducive to reducing the resistance of the P-type region gate structure at the boundary between the first P-type region II1 and the N-type region gate structure 105 such that the operation speed of the P-type device may be improved and the electrical performance of the semiconductor device may also be improved. For example, the AC performance of the semiconductor device may be improved. In addition, according to the disclosed semiconductor device, the channel length of the P-type device may still meet the device requirements.

Figure 6:
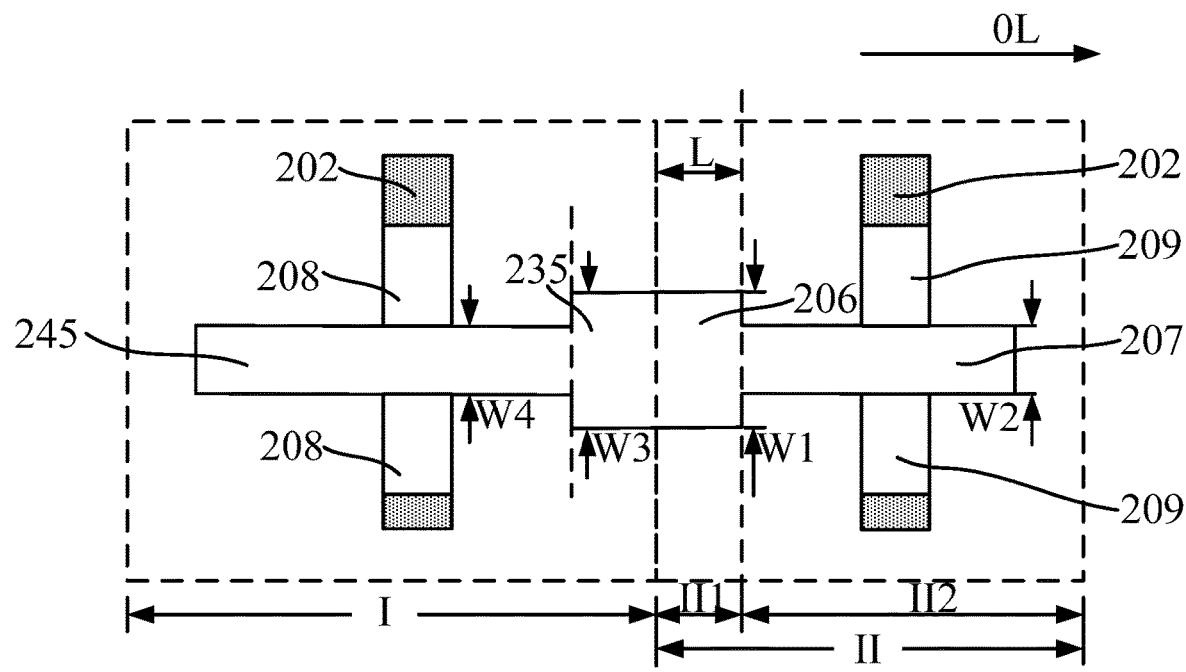
FIGS. 6-7 illustrate schematic views of another exemplary semiconductor device consistent with various embodiments of the present disclosure.
Figure 7:
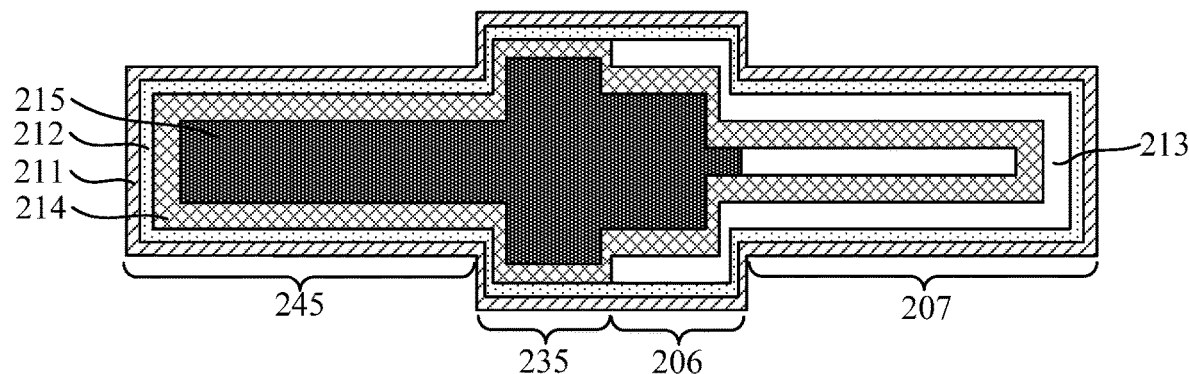

The present disclosure also provides another semiconductor device. FIGS. 6 and 7 show schematic cross-section views of an exemplary semiconductor device consistent with various embodiments of the present disclosure. Specifically, FIG. 6 shows a schematic top view of the semiconductor device. FIG. 7 shows an enlarged top view of the gate structure in the semiconductor device shown in FIG. 6.

Referring to FIGS. 6-7, the semiconductor device may include a base substrate and an interlayer dielectric layer (not shown) formed on the base substrate. The base substrate may further include an NMOS region I and a PMOS region II adjacent to the NMOS region I. An N-type device may be formed in the NMOS region I and a P-type device may be formed in the PMOS region II. Moreover, the PMOS region II may include a first P-type region II1 adjacent to the NMOS region I and a second P-type region II2 adjacent to the first P-type region II1.

The semiconductor device may also include a gate structure formed through the interlayer dielectric layer. The gate structure may include an N-type region gate structure (not labeled) formed on the base substrate in the NMOS region I, a first gate structure 206 formed on the base substrate in the first P-type region II1 and connected to the N-type region gate structure, and a second gate structure 207 formed on the base substrate in the second P-type region II2 and connected to the first gate structure 206. The direction from the N-type region gate structure to the second gate structure 207 may be the extending direction 0L of the gate structure. Along a direction perpendicular to the extending direction 0L of the gate structure, the width W1 of the first gate structure 206 may be larger than the width W2 of the second gate structure 207.

The semiconductor device may include an N-type source/drain doped region 208 formed in the base substrate on each side of the N-type gate structure and a P-type source/drain doped region 209 formed in the base substrate on each side of the P-type gate structure.

Further, the gate structure may include a gate dielectric layer 211 formed on the base substrate in the NMOS region I and the PMOS region II and also on the sidewall surfaces of the interlayer dielectric layer 204, a P-type WF layer 213 formed on the gate dielectric layer 211 in the first P-type region II1 and the second P-type region II2, an N-type WF layer 214 formed on the gate dielectric layer 211 in the NMOS region I and also on the P-type WF layer 213, and a gate electrode layer 215 formed on the N-type WF layer 214 in the NMOS region I and also on the N-type WF layer 214 in the first P-type region II1.

In the following, a Fin-FET device is described as an example to illustrate the disclosed semiconductor device. Referring to FIGS. 6-7, the base substrate of the semiconductor device may include a substrate (not shown) and a plurality of fin structures 202 protruding from the substrate. The base substrate may also include an isolation structure (not shown) formed on the substrate between neighboring fin structures 202.

The semiconductor device may also include a barrier layer 212 formed on the gate dielectric layer 211 formed in the NMOS region I, the first P-type region II1, and the second P-type region II2. Accordingly, the P-type WF layer 213 may be formed on the barrier layer 212 in the first P-type region II1 and the second P-type region II2. The barrier layer 212 may be made of TiN or TaN.

In various embodiments, the base substrate, the interlayer dielectric layer, the N-type source/drain doped region 208, the P-type source/drain doped region 209, the gate dielectric layer 211, the barrier layer 212, the P-type WF layer 213, the N-type WF layer 214 depicted in FIGS. 6-7 may be substantially the same or similar with corresponding layers depicted in FIGS. 3-5.

In one embodiment, along the direction perpendicular to the extending direction 0L of the gate structure, a difference between the width W1 of the first gate structure 206 and the width W2 of the second gate structure 207 may be in a range of approximately 1 nm to 5 nm. Moreover, along the extending direction 0L of the gate structure, the length L of the first gate structure may be in a range of approximately 3 nm to 5 nm.

Different from the N-type region gate structure in embodiments described above, the N-type region gate structure in the present embodiment may include a third gate structure 235 connected to the first gate structure 206 and a fourth gate structure 245 connected to the third gate structure 235. Accordingly, the N-type source/drain doped regions 208 may be formed in the base substrate on both sides of the fourth gate structure 245. Moreover, along the direction perpendicular to the extending direction 0L of the gate structure, the width W3 of the third gate structure 235 may be larger than the width W4 of the fourth gate structure 245.

In one embodiment, along the direction perpendicular to the extending direction 0L of the gate structure, the width W4 of the fourth gate electrode 245 may be equal to the width W2 of the second gate structure 207. Therefore, the channel length in the N-type device may be the same as the channel length of the P-type device such that the device performance requirements are satisfied.

In one embodiment, along the direction perpendicular to the extending direction 0L of the gate structure, the width W3 of the third gate structure 235 may be equal to the width W1 of the first gate structure 206. As such, the method for forming the gate structure of the semiconductor device may be simplified.

Moreover, along the extending direction 0L of the gate structure, the length of the third gate structure 235 may not be too large or too small. When the length of the third gate structure 235 is too large, the third gate structure 235 may have undesired influence on the channel length of the N-type device. However, when the length of the third gate structure 235 is too small, the short length of the third gate structure 235 may not have significant effect on improving the filling ability of the gate electrode layer 215 in the first gate structure 206. Therefore, in one embodiment, along the extending direction 0L of the gate structure, the length of the third gate structure 235 is in a range of approximately 1 nm to 5 nm.

In one embodiment, the top surface of the gate electrode layer 215 may be leveled with the top surface of the portion of the N-type WF layer 214 formed on the sidewall surfaces of the interlayer dielectric layer 204 in the NMOS region I. The top surface of the gate electrode layer 215 may also be leveled with the top surface of the portion of the N-type WF layer 214 formed on the sidewall surfaces of the interlayer dielectric layer 204 in the first P-type region II1. In addition, the gate electrode layer 215 may also be formed on the portion of the N-type WF layer 214 formed in the second P-type region II2.

The gate electrode layer 215 depicted in FIGS. 6-7 may be substantially the same or similar with corresponding layer depicted in FIGS. 3-5.

In one embodiment, in a plane parallel to the surface of the base substrate, the cross section of the gate structure may have a cross shape. Specifically, the fourth gate structure 245 and the second gate structure 207 may together form a horizontal bar of the cross, and the third gate structure and the first gate structure 206 may together form a vertical bar of the cross.

In one embodiment, the third gate structure 235 may be next to the first gate structure 206. In addition, because the width W3 of the third gate structure 235 may be greater than the width W4 of the fourth gate structure 245, the space that the third gate structure 235 is able to provide for the gate electrode layer 215 may be larger than the space that the fourth gate structure 245 is able to provide for the gate electrode layer 215. Moreover, because the third gate structure 235 may be next to the first gate structure 206, the gate electrode layer 215 formed in the first P-type region II1 may easily fill into the first P-type region II1 such that the filling effect of the gate electrode layer 215 in the first gate structure 206 may be improved. Therefore, the resistance of the first gate structure 206 may be further reduced. Accordingly, the resistance of the P-type region gate structure may be reduced and the operation speed of the P-type device may be further improved.

Figure 12:
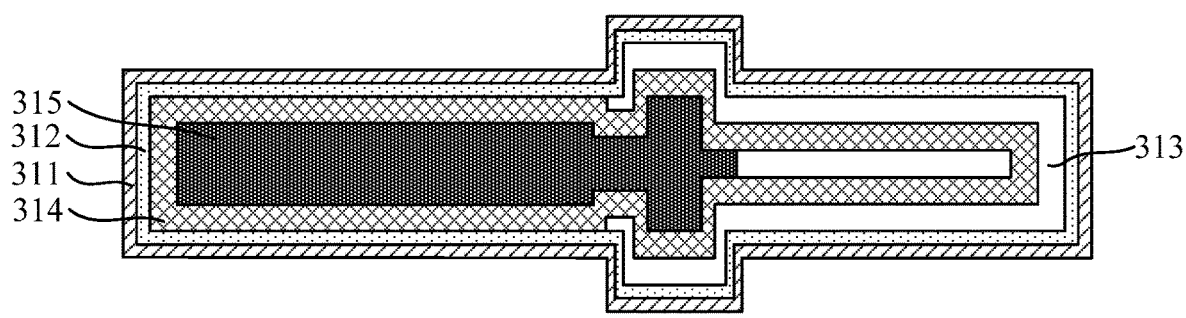
Figure 13:
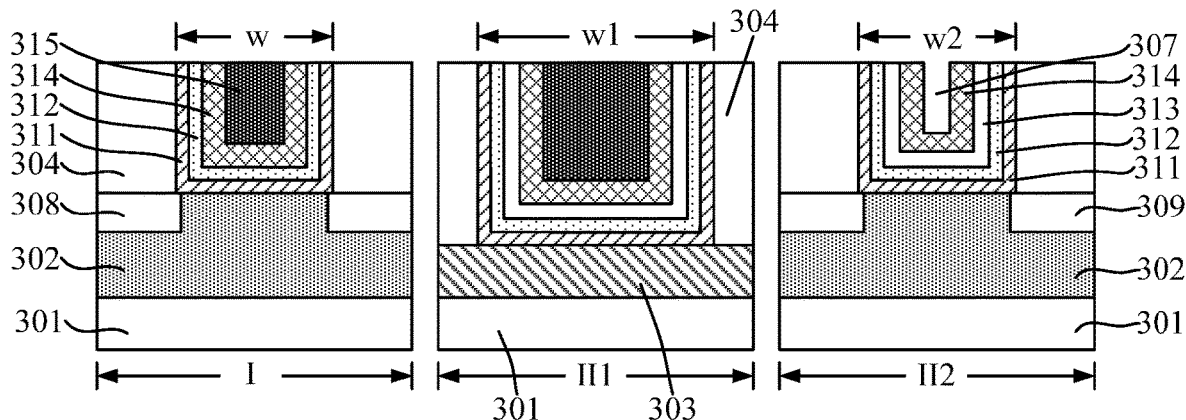
Figure 14:
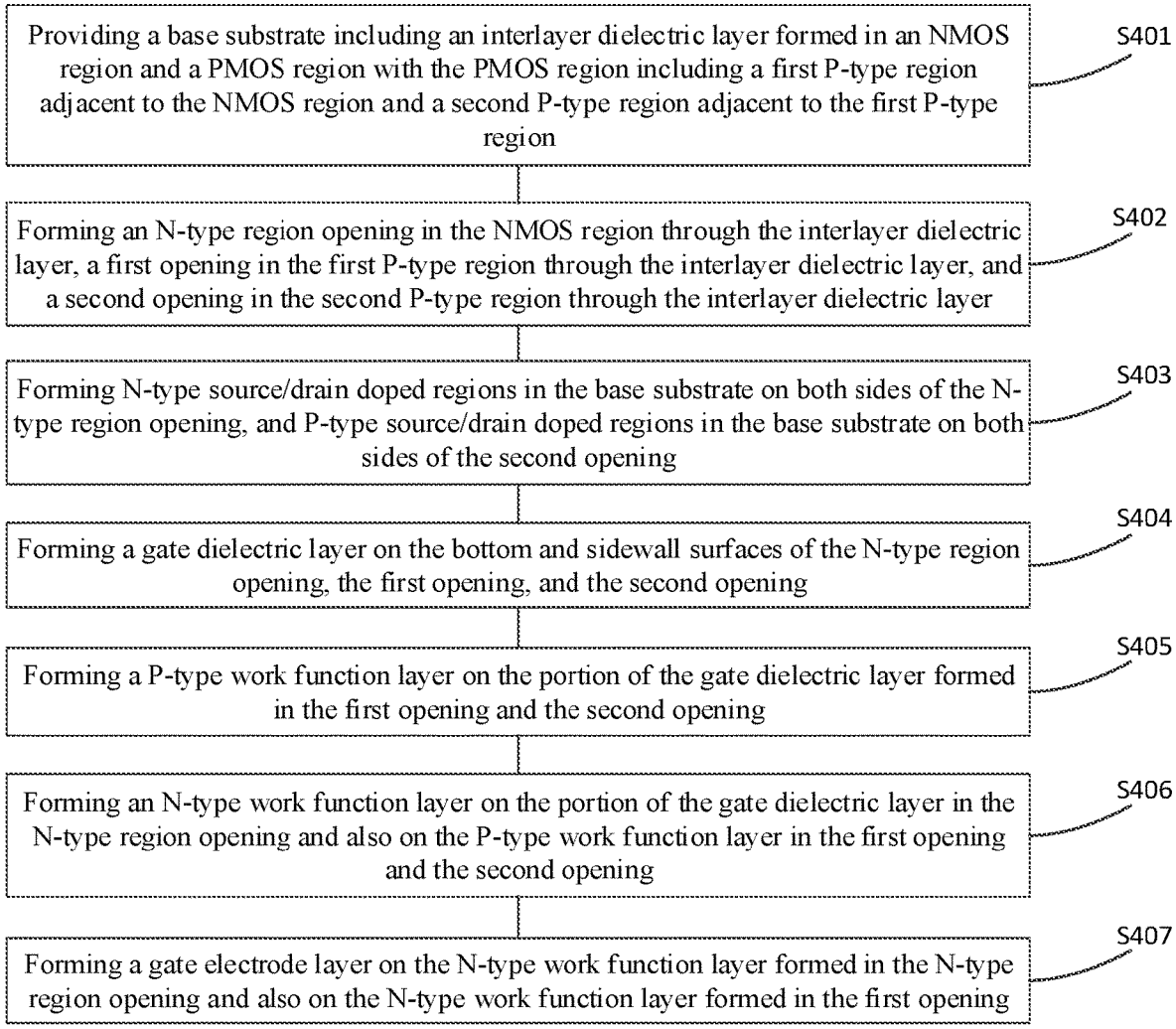
FIG. 14 illustrates a flowchart of an exemplary method for fabricating a semiconductor device consistent with various disclosed embodiments of the present disclosure.

Moreover, the present disclosure also provides a method for fabricating semiconductor devices. FIG. 14 illustrates a flowchart of an exemplary method for fabricating a semiconductor device consistent with various disclosed embodiments in the present disclosure. FIGS. 8-13 illustrate schematic views of semiconductor structures at certain stages of the fabricating method.

Figure 8:
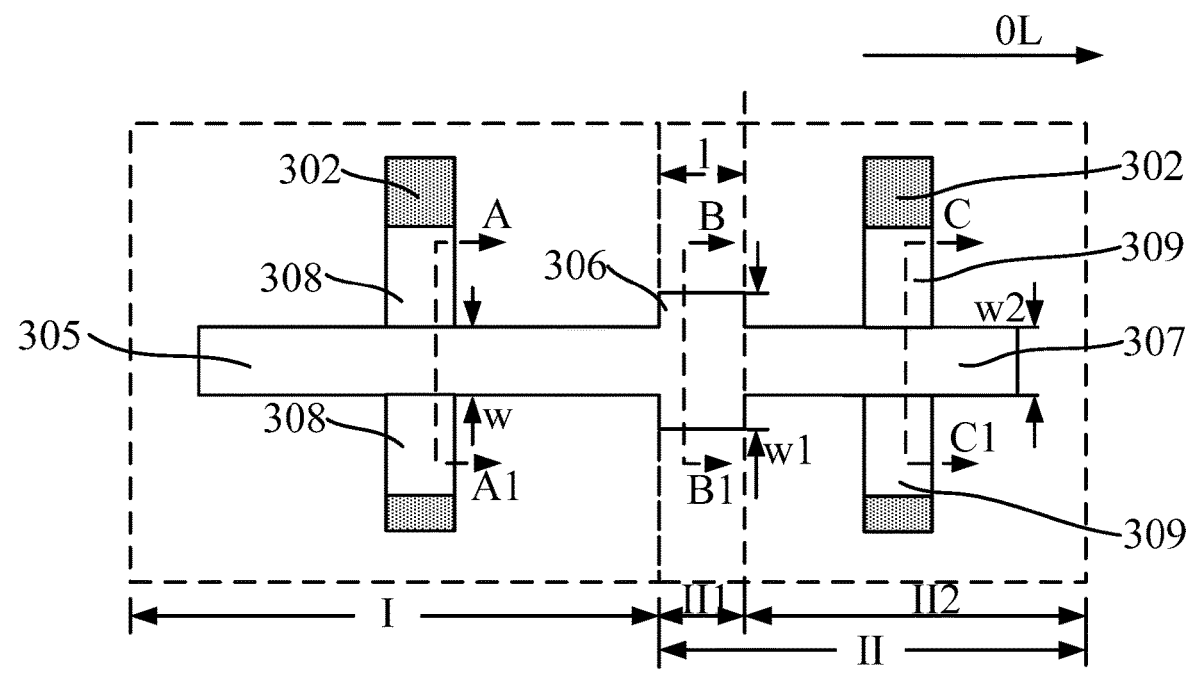
FIGS. 8-13 illustrate schematic views of semiconductor structures at certain stages of an exemplary fabrication process for forming a semiconductor device consistent with various embodiments of the present disclosure.
Figure 9:
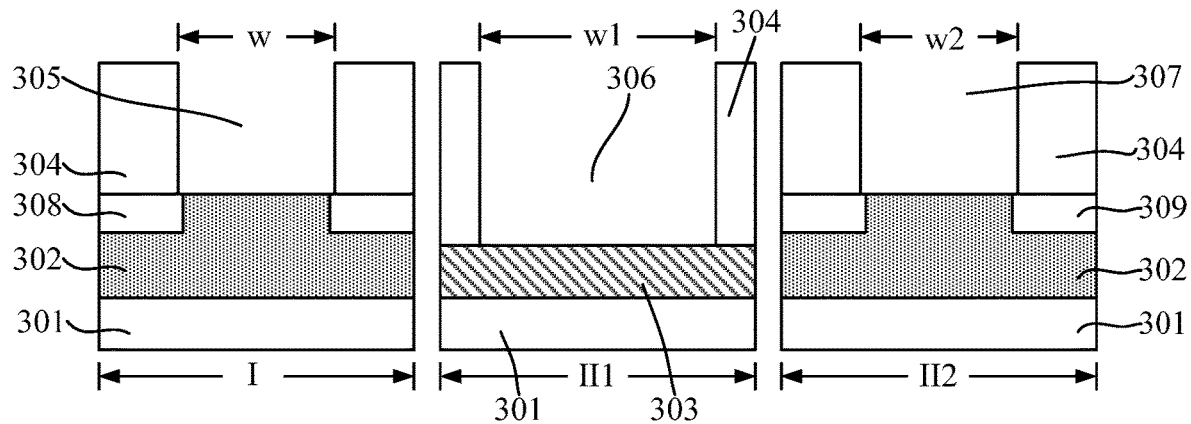

Referring to FIG. 14, at the beginning of the fabrication method, a base substrate including an interlayer dielectric layer formed in an NMOS region and a PMOS region may be provided, the PMOS region including a first P-type region adjacent to the NMOS region, and a second P-type region adjacent to the first P-type region (S401). FIGS. 8-9 show schematic views of a corresponding semiconductor structure. Specifically, FIG. 8 shows a schematic top view of the semiconductor structure. The left panel of FIG. 9 shows a cross-section view of the semiconductor structure shown in FIG. 8 along an AA1 direction, the middle panel of FIG. 9 shows a cross-section view of the semiconductor structure shown in FIG. 8 along a BB1 direction, and the right panel of FIG. 9 shows a cross-section view of the semiconductor structure shown in FIG. 8 along a CC1 direction. For illustration purpose, the interlayer dielectric layer is not shown in FIG. 8.

Referring to FIGS. 8-9, a base substrate including an interlayer dielectric layer 304 formed on the base substrate may be provided. The base substrate may include an NMOS region I and a PMOS region II adjacent to the NMOS region I. The NMOS region I may be used to form an N-type device and the PMOS region II may be used to form a P-type device. The PMOS region II may further include a first P-type region II1 adjacent to the NMOS region I, and a second P-type region II2 adjacent to the first P-type region II1.

Further, returning back to FIG. 14, an N-type region opening may be formed through the interlayer dielectric layer in the NMOS region, a first opening may be formed through the interlayer dielectric layer in the first P-type region, and a second opening may be formed through the interlayer dielectric layer in the second P-type region (S402). FIGS. 8-9 schematically show the N-type region opening, the first opening, and the second opening formed in the semiconductor structure.

Referring to FIGS. 8-9, an N-type region opening 305 may be formed in the portion of the interlayer dielectric layer 304 in the NMOS region I, and a first opening 306 connected to the N-type region opening 305 may be formed in the portion of the interlayer dielectric layer 304 in the first P-type region II1, and a second opening 307 connected to the first opening 306 may be formed in the portion of the interlayer dielectric layer 304 in the second P-type region II2. Further, a direction from the N-type region opening 305 to the second opening 307 may be the extending direction 0L of the gate structure. Along a direction perpendicular to the extending direction 0L of the gate structure, the width w1 of the first opening 306 may be larger than the width w2 of the second opening 307. In addition, along the direction perpendicular to the extending direction 0L of the gate structure, an N-type source/drain doped region 308 may be formed in the base substrate on each side of the N-type region opening 305, and a P-type source/drain doped region 309 may be formed in the base substrate on each side of the second opening 307.

In one embodiment, the base substrate may include a substrate 301 and a plurality of fin structures 302 protruding from the substrate 301. The base substrate may also include an isolation structure 303 formed on the substrate 301 between neighboring fin structures 302. The isolation structure 303 may cover a portion of the sidewall surfaces of each fin structure 302, and the top surface of the isolation structure 303 may be lower than the top surfaces of the plurality of fin structures 302.

The N-type region opening 305 may provide a process basis for subsequent formation of an N-type region gate structure, the first opening 306 may provide a process basis for subsequent formation of a first gate structure, and the second opening 307 may provide a process basis for subsequent formation of a second gate structure. Moreover, the second gate structure and the first gate structure may together form a P-type gate structure for the P-type device.

In one embodiment, when the subsequently-formed N-type region gate structure keeps a constant width along the direction perpendicular to the extending direction 0L of the gate structure, the N-type region opening 305 may also keep a constant width along the direction perpendicular to the extending direction 0L of the gate structure. In addition, along the direction perpendicular to the extending direction 0L of the gate structure, the width W of the N-type region opening 305 may be equal to the width W2 of the second opening 307 so that the channel length of the subsequently-formed N-type device may be equal to the channel length of the subsequently-formed P-type device. Moreover, along the direction perpendicular to the extending direction 0L of the gate structure, the width W1 of the first opening 306 may be larger than the width W of the N-type region opening 305.

In one embodiment, along the direction perpendicular to the extending direction 0L of the gate structure, the difference between the width W1 of the first opening 306 and the width W2 of the second opening 307 is in a range of approximately 1 nm to 5 nm. Moreover, the length of the first opening 306 along the direction perpendicular to the extending direction 0L of the gate structure is in a range of approximately 3 nm to 5 nm.

In other embodiments, the subsequently-formed N-type region gate structure may include a third gate structure connected to the first gate structure and a fourth gate structure connected to the third gate structure, and the fourth gate structure may be used to define the channel length of the N-type device. Accordingly, the N-type region opening may include a third opening connected to the first opening and a fourth opening connected to the third opening. Moreover, along the direction perpendicular to the extending direction of the gate structure, the width of the third opening may be larger than the width of the fourth opening, the width of the third opening and the width of the first opening may be equal to each other, and the width of the fourth opening and the width of the second opening may be equal to each other.

Returning to FIG. 14, further, N-type source/drain doped regions may be formed in the base substrate on both sides of the N-type region opening and P-type source/drain doped regions may be formed in the base substrate on both sides of the second opening (S403). FIGS. 8-9 schematically show the N-type source/drain doped regions and the P-type source/drain doped regions formed in the semiconductor structure.

Referring to FIGS. 8-9, in one embodiment, an N-type source/drain doped region 308 may be formed in the base substrate on each side of the N-type region opening 305 and a P-type source/drain doped region 309 may be formed in the base substrate on each side of the second opening 307.

In other embodiments, the N-type region opening may include a third opening connected to the first opening and a fourth opening connected to the third opening. Accordingly, the N-type source/drain doped regions may be formed in the base substrate on the opposite sides of the fourth opening.

The interlayer dielectric layer 304, the N-type region opening 305, the first opening 306, the second opening 307, the N-type source/drain doped region 308, and the P-type source/drain doped region 309 may be formed by any appropriate semiconductor fabrication process encompassed in the present disclosure.

For example, in one embodiment, the interlayer dielectric layer 304, the N-type region opening 305, the first opening 306, the second opening 307, the N-type source/drain doped region 308, and the P-type source/drain doped region 309 may be fabricated by a process including the following exemplary steps.

First, a dummy gate structure may be formed on the base substrate. The dummy gate structure may include an N-type region dummy gate structure formed on the base substrate in the NMOS region I, a first dummy gate structure formed on the base substrate in the first P-type region II1 and connected to the N-type region dummy gate structure, and a second dummy gate structure formed on the base substrate in the second P-type region II2 and connected to the first dummy gate structure. The direction from the N-type region dummy gate structure to the second dummy gate structure may be the extending direction of the dummy gate structure, and thus may also be the extending direction 0L of the subsequently-formed gate structure. Moreover, along the direction perpendicular to the extending direction 0L of the dummy gate structure, the width of the first dummy gate structure may be larger than the width of the second dummy gate structure, and the width of the first dummy gate structure may be equal to the width of the second dummy gate structure.

Further, along the direction perpendicular to the extending direction 0L of the dummy gate structure, an N-type source/drain doped region 308 may be formed in the base substrate on each side of the N-type region dummy gate structure, and a P-type source/drain doped region 309 may be formed in the base substrate on each side of the second dummy gate structure. Further, an interlayer dielectric layer 304 may be formed on the portion of the base substrate exposed by the dummy gate structure. The interlayer dielectric layer 304 may expose the top surfaces of the N-type region dummy gate structure, the first dummy gate structure, and the second dummy gate structure.

Moreover, an N-type region opening 305 may be formed by removing the N-type region gate structure, a first opening 306 may be formed by removing the first dummy gate structure, and a second opening 307 may be formed by removing the second dummy gate structure.

In one embodiment, unless otherwise specified, subsequent fabrication process may be performed based on the structure illustrated in FIG. 9.

Figure 10:
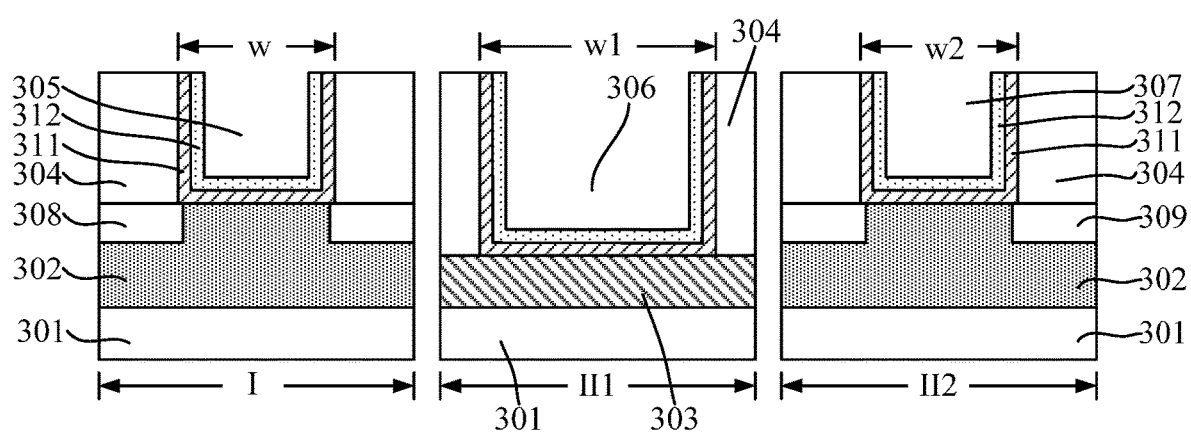

Returning back to FIG. 14, a gate dielectric layer may be formed on the bottom and sidewall surfaces of the N-type region opening, the first opening, and the second opening (S404). FIG. 10 shows schematic cross-section views of a corresponding semiconductor structure.

Referring to FIG. 10, a gate dielectric layer 311 may be formed on the bottom and sidewall surfaces of the N-type region opening 305, the first opening 306, and the second opening 307. The gate dielectric layer 311 may also be formed on the top surface of the interlayer dielectric layer 304. In a subsequent fabrication process, the portion of the gate dielectric layer 311 formed on the top surface of the interlayer dielectric layer 304 may be removed.

In one embodiment, the gate dielectric layer 311 may include an interfacial layer (not shown) and a high-k dielectric layer (not shown) formed on the interfacial layer. Moreover, during the fabrication process for the gate dielectric layer 311, the gate dielectric layer 311 may be formed across the fin structure 302 and may cover a portion of the top and the sidewall surfaces of the fin structure 302.

The interfacial layer may provide a desired interface for the high-k dielectric layer such that the quality of the high-k dielectric layer may be improved. As such, the density of interfacial states between the high-k dielectric layer and the fin structure 302 may be reduced, preventing undesired effects due to direct contact between the high-k dielectric layer and the fin structure 302.

The materials used to form the interfacial layer and the high-k dielectric layer may refer to the corresponding description in the above embodiments of the disclosed semiconductor structure.

In one embodiment, the interfacial layer may be formed by an oxidation process. The interfacial layer may only be formed on the exposed portion of the top and the sidewall surfaces of the fin structure 302. In other embodiments, the interfacial layer may be formed by a deposition process, such as chemical vapor deposition (CVD), physical vapor deposition (PVD), atomic layer deposition (ALD), etc. Accordingly, the interfacial layer may also be formed on the isolation structure 302.

In one embodiment, the high-k dielectric layer may be formed by an ALD process. In other embodiments, the high-k dielectric layer may be formed by a CVD or PVD process.

Further, after forming the gate dielectric layer 311, the fabrication process may also include forming a barrier layer 312 on the gate dielectric layer 311 in the NMOS region I, the first P-type region II1, and the second P-type region II2. The barrier layer 312 may provide protection for the gate dielectric layer 311 during subsequent fabrication process. The barrier layer 312 may be made of TiN or TaN.

Figure 11:
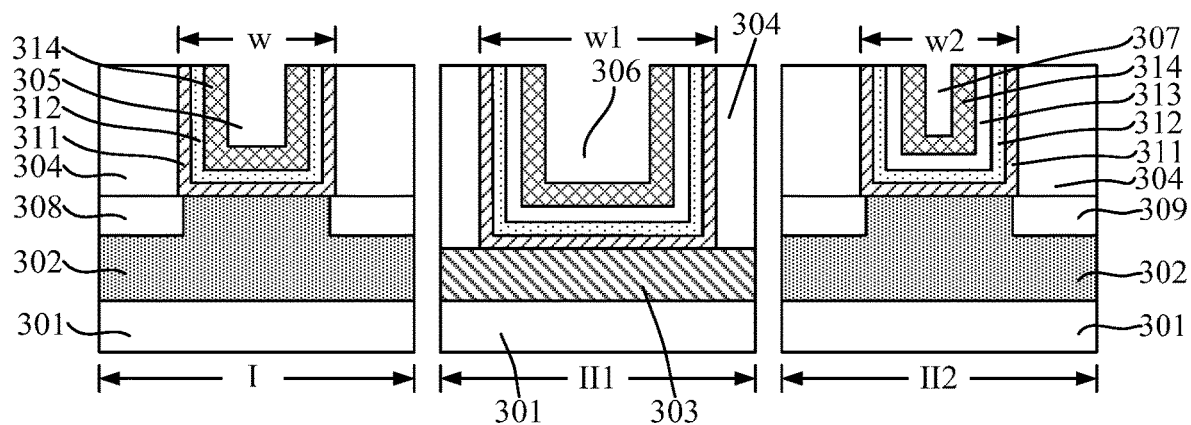

Further, returning to FIG. 14, a P-type work function layer may be formed on the portion of the gate dielectric layer formed in the first opening and the second opening (S405). FIG. 11 shows schematic cross-section views of a corresponding semiconductor structure.

Referring to FIG. 11, a P-type WF layer 313 may be formed on the portion of the gate dielectric layer 311 formed in the first opening 306 and the second opening 307.

In one embodiment, the P-type WF layer 313 may only be formed in the PMOS region II. The P-type WF layer 313 may also be formed on the top surface of the interlayer dielectric layer 304 in the PMOS region II.

The P-type WF layer 313 may be formed by a process including the following steps. First, a P-type WF film may be formed on the barrier layer 312 in the N-type region opening 305, the first opening 306, and the second opening 307. The portion of the P-type WF film formed on the NMOS region I may then be removed to form the P-type WF layer 313.

In one embodiment, the P-type WF layer 313 may be formed by an ALD process. In other embodiments, the P-type region WF layer may be formed by a CVD or a PVD process.

Further, returning to FIG. 14, an N-type work function layer may be formed on the portion of the gate dielectric layer in the N-type region opening and also on the P-type work function layer in the first opening and the second opening (S406). FIG. 11 shows schematic cross-section views of a corresponding semiconductor structure.

Referring to FIG. 11, an N-type WF layer 314 may be formed on the portion of gate dielectric layer 311 in the N-type region opening 305 and also on the P-type WF layer 313. In one embodiment, a barrier layer 312 may be formed on the gate dielectric layer 311 formed in the N-type region opening, and accordingly, during the process to form the N-type WF layer 314, the N-type WF layer 314 may then be formed on the portion of the barrier layer 312 in the N-type region opening 305 and also on the P-type WF layer 313.

In one embodiment, the N-type WF layer 314 may be formed by an ALD process. In other embodiments, the N-type WF layer may be formed by a CVD or a PVD process.

Further, returning to FIG. 14, a gate electrode layer may be formed on the N-type work function layer formed in the N-type region opening and also on the N-type work function layer formed in the first opening (S407). FIGS. 12-13 show schematic views of a corresponding semiconductor structure. Specifically, FIG. 12 illustrates an enlarged top view of the gate structure. FIG. 13 shows cross-section views of the semiconductor structure developed from the structure shown in FIG. 11.

Referring to FIGS. 12-13, a gate electrode layer 315 may be formed on the portion of the N-type WF layer 314 in the N-type region opening 305 (referring to FIG. 11). Moreover, the gate electrode layer 315 may also be formed on the portion of the N-type WF layer 314 formed in the N-type region opening 305 (referring to FIG. 11). The gate electrode layer 315 may be made of Cu, Al, or W.

The gate electrode layer 315 may be formed by a process including the following steps. First, a gate electrode film may be formed to fill up the N-type region opening 305, the first opening 306, and the second opening 307. The top surface of the gate electrode film may be higher than the top surface of the interlayer dielectric layer 304. Further, the gate electrode layer 315 may then be formed by removing the portion of the gate electrode film formed above the top surface of the interlayer dielectric layer 304 through polishing. During the process to remove the portion of the gate electrode film formed above the top surface of the interlayer dielectric layer 304, the portion of the N-type WF layer 314, the P-type WF layer 313, the barrier layer 312, and the gate dielectric layer 311 formed above the top surface of the interlayer dielectric layer 304 may also be removed.

The gate dielectric layer 311, the barrier layer 312, the P-type WF layer 313, the N-type WF layer 314, and the gate electrode layer 315 may together form a gate structure. Specifically, the portion of the gate structure formed in the NMOS region I may become an N-type region gate structure, the portion of the gate structure formed in the first P-type region II1 may become the first gate structure, and the portion of the gate structure formed in the second P-type region II2 may become the second gate structure. Further, along the direction perpendicular to the extending direction 0L of the gate structure, the width of the first gate structure may be larger than the width of the second gate structure.

In one embodiment, along the direction perpendicular to the extending direction 0L of the gate structure, the width of the N-type region gate structure may be equal to the width of the second gate structure. Accordingly, the width of the first gate structure may also be larger than the width of N-type region gate structure.

In one embodiment, prior to forming the gate electrode layer 315, the number of film layers formed in the N-type region opening 305 may be smaller than the number of film layers formed in the second opening 307. Therefore, the space reserved for forming the gate electrode layer 315 in the N-type region opening 305 may be larger than the space reserved for forming the gate electrode layer 315 in the second opening 307 such that the gate electrode layer 315 may be easily fill up the N-type region opening 305. As such, the top surface of the gate electrode layer 315 may be leveled with the top surface of the N-type WF layer 314 formed on the sidewall surfaces of the N-type region opening 305. Because the space reserved for forming the gate electrode layer 315 in the second opening 307 may be relatively small, it may be more difficult for the gate electrode layer 315 to fill up the second opening 307. That is, the gate electrode layer 315 may not be easily filled into the second opening 307.

Prior to forming the gate electrode layer 315, the number of film layers formed in the first opening 306 may be the same as the number of film layers formed in the second opening 307. Therefore, along the direction perpendicular to the extending direction 0L of the gate structure, the width of the first opening may be larger than the width of the second opening such that filling the gate electrode layer 315 into the first opening 306 may be relatively easy. Therefore, the gate electrode layer 315 may be formed on the N-type WF layer 314 in the first P-type region II1, and thus the resistance of the first gate structure may be reduced and the operation speed of the P-type device may be improved.

In one embodiment, the gate electrode layer 315 may fill up the first opening 306. In other embodiments, the gate electrode layer formed in the first P-type region may include a gap.

In one embodiment, the gate electrode layer 315 may also be formed on the portion of the N-type WF layer 314 formed in the second P-type region II2.

Moreover, along the direction perpendicular to the extending direction 0L of the gate structure, the width of the second opening 307 may be equal to the width of the N-type region opening 305. Therefore, the channel length in the formed N-type device may be the same as the channel length in the formed P-type device such that the device performance requirements may be satisfied.

In other embodiments, the N-type region opening may include a third opening connected to the first opening and a fourth opening connected to the third opening. Along the direction perpendicular to the extending direction of the gate structure, the width of the third opening may be larger than the width of the fourth opening. Because the third opening is next to the first opening, the process difficulty in filling the first opening with the gate electrode layer may be further reduced, ensuring the gate electrode layer filling up the first opening. Therefore, the operation speed of the formed P-type device may be further improved. Moreover, corresponding to the N-type region opening including the third opening and the fourth opening, the N-type region gate structure may include a third gate structure connected to the first gate structure and a fourth gate structure connected to the third gate structure. The N-type source/drain doped regions may thus be formed in the base substrate on both sides of the fourth opening. Along the direction perpendicular to the extending direction of the gate structure, the width of the third gate structure may be larger than the width of the fourth gate structure, the width of the fourth gate structure may be equal to the width of the second gate structure, and the width of the third gate structure may be equal to the width of the first gate structure.

Compared to conventional fabrication methods and semiconductor devices, the disclosed fabrication methods and semiconductor devices may demonstrate several advantages.

According to the disclosed fabrication methods and semiconductor devices, an NMOS region including an N-type device may be adjacent to a PMOS region including a P-type device. The PMOS region may further include a first P-type region and a second P-type region next to the first P-type region. The first P-type region of the PMOS region may be adjacent to the NMOS region and the second P-type region of the PMOS region may be adjacent to the first P-type region. An N-type region gate structure may be formed on the base substrate in the NMOS region, a first gate structure may be formed on the base substrate in the first P-type region and connected to the N-type region gate structure, and a second gate structure may be formed on the base substrate in the second P-type region and connected to the first gate structure. Further, along the direction perpendicular to the extending direction of the gate structure, the width of the first gate structure may be larger than the width of the second gate structure. In addition, the width of the second gate structure may define the channel length of the P-type device.

According to the disclosed fabrication methods and semiconductor devices, the gate structure may include a gate dielectric layer, a P-type WF layer formed in both the first P-type region and the second P-type region, an N-type WF layer formed on the portion of the gate dielectric layer in the NMOS region and also on the P-type WF layer, and a gate electrode layer formed on the portion of the N-type WF layer formed in the NMOS region and the first P-type region. Moreover, along the direction perpendicular to the extending direction of the gate structure, the width of the first gate structure may be larger than the width of the second gate structure. Therefore, the space reserved for forming the gate electrode layer in the first gate structure may be larger than the space reserved for forming the gate electrode layer in the second gate structure such that the gate electrode layer may be able to fill onto the N-type WF layer in the first P-type region. Therefore, the resistance of the P-type region gate structure next to the N-type gate structure may be reduced. As such, the response speed of the P-type device may be improved, and the electrical performance of the semiconductor device may be improved.

In one embodiment, along the direction perpendicular to the extending direction of the gate structure, the width of the N-type region gate structure may be equal to the width of the second gate structure. Further, the N-type region gate structure may be used to define the channel length of the N-type device. Therefore, the channel length in the formed N-type device may be the same as the channel length in the formed P-type device such that the device performance requirements may be satisfied.

In one embodiment, the N-type region gate structure may include a third gate structure connected to the first gate structure and a fourth gate structure connected to the third gate structure. Accordingly, the N-type source/drain doped regions may be formed in the base substrate on both sides of the fourth opening. Specifically, along the direction perpendicular to the extending direction of the gate structure, the width of the third gate structure is larger than the width of the fourth gate structure. Because the third gate structure is next to the first gate structure and the width of the third gate structure may be relatively large, the ability of filling the gate electrode layer onto the N-type WF layer in the first P-type region may be further improved. As such, the resistance of the P-type region gate structure in the P-type device may be further reduced, and the response speed of the P-type device may be improved.

The above detailed descriptions only illustrate certain exemplary embodiments of the present invention, and are not intended to limit the scope of the present invention. Those skilled in the art can understand the specification as whole and technical features in the various embodiments can be combined into other embodiments understandable to those persons of ordinary skill in the art. Any equivalent or modification thereof, without departing from the spirit and principle of the present invention, falls within the true scope of the present invention.

What is claimed is:

1. A method for fabricating a semiconductor device, comprising:

forming an interlayer dielectric layer on a base substrate, wherein the base substrate includes an NMOS region and a PMOS region adjacent to the NMOS region, the PMOS region includes a first P-type region adjacent to the NMOS region and a second P-type region adjacent to the first P-type region, the NMOS region is used to form an N-type device, and the PMOS region is used to form a P-type device; and forming an N-type region opening in the NMOS region through the interlayer dielectric layer, a first opening in the first P-type region through the interlayer dielectric layer and connected to the N-type region opening, and a second opening in the second P-type region through the interlayer dielectric layer and connected to the first P-type opening, wherein:

a direction from the N-type region opening to the second opening is an extending direction of the N-type region opening, the N-type region opening is connected with the second opening through the first opening, along a direction perpendicular to the extending direction of the N-type region opening, a width of the first opening is larger than a width of the second opening, and along the direction perpendicular to the extending direction of the N-type region opening, a width of the N-type region opening is smaller than the width of the first opening.

2. The method according to claim 1, further including:
forming N-type source/drain doped regions in the base substrate on two opposite sides of the N-type opening and P-type source/drain doped regions in the base substrate on two opposite sides of the second opening;
forming a gate dielectric layer on top and sidewall surfaces of the N-type region opening, the first opening, and the second opening;
forming a P-type work function layer on the gate dielectric layer formed in the first opening and the second opening;
forming an N-type work function layer on the gate dielectric layer in the N-type region opening and also on the P-type work function layer; and
forming a gate electrode layer on the N-type work function layer formed in the N-type region opening and the first opening.

3. The method according to claim 2, wherein:
the P-type work function layer is directly sandwiched by the N-type work function layer and the gate electrode layer in the PMOS region.

4. The method according to claim 2, wherein:
a top surface of the gate electrode layer is leveled with a top surface of the N-type work function layer formed on the sidewall surfaces of the interlayer dielectric layer in the NMOS region.

5. The method according to claim 4, wherein:
the top surface of the gate electrode layer is also leveled with a top surface of the N-type work function layer formed on the sidewall surfaces of the interlayer dielectric layer in the first P-type region.

6. The method according to claim 1, wherein:
the gate electrode layer is formed to fill up the N-type region opening and the first opening.

7. The method according to claim 1, wherein forming the interlayer dielectric layer, the N-type region opening, the first opening, the second opening, N-type source/drain doped regions, and P-type source/drain doped regions includes:

forming a dummy gate structure on the base substrate, wherein the dummy gate structure includes an N-type region dummy gate structure formed on the base substrate in the NMOS region, a first dummy gate structure formed on the base substrate in the first P-type region, and a second dummy gate structure formed on the base substrate in the second P-type region, and along a direction perpendicular to a direction from the N-type region dummy gate structure to the second dummy gate structure, a width of the first dummy gate structure is larger than a width of the second dummy gate structure;

forming the N-type source/drain doped regions in the base substrate on both sides of the N-type region dummy gate structure along the direction perpendicular to the direction from the N-type region dummy gate structure to the second dummy gate structure;

forming the P-type source/drain doped regions in the base substrate on both sides of the second dummy gate structure along the direction perpendicular to the direction from the N-type region dummy gate structure to the second dummy gate structure;

forming the interlayer dielectric layer on a portion of the base substrate exposed by the dummy gate structure, wherein the interlayer dielectric layer exposes top surfaces of the N-type region dummy gate structure, the first dummy gate structure, and the second dummy gate structure; and forming the N-type region opening by removing the N-type region dummy gate structure, the first opening by removing the first dummy gate structure, and the second opening by removing the second dummy gate structure.

8. The method according to claim 1, wherein:
along the direction perpendicular to the extending direction of the N-type region opening, the width of the N-type region opening is equal to the width of the second opening.

9. The method according to claim 1, wherein:
along the direction perpendicular to the extending direction of the N-type region opening, a difference between the width of the first opening and the width of the second opening is in a range of approximately 1 nm to 5 nm.

10. The method according to claim 1, wherein:
along the direction perpendicular to the extending direction of the N-type region opening, the width of the first opening is in a range of approximately 3 nm to 5 nm.

11. The method according to claim 1, further including:
a barrier layer formed on the gate dielectric layer in the NMOS region, the first P-type region, and the second P-type region.

12. The method according to claim 11, further including:
the barrier layer is made of TiN or TaN, wherein:
the P-type work function layer is formed on the barrier layer in the first P-type region and the second P-type region.

13. The method according to claim 11, wherein:
the N-type work function layer is directly sandwiched by the barrier layer and the gate electrode layer in the NMOS region.

14. The method according to claim 1, wherein:
along a direction parallel to a surface of the base substrate, a cross section of an opening including the N-type region opening, the second opening, and the first opening has a cross shape.

15. The method according to claim 1, wherein:
the base substrate includes a substrate and a plurality of fin structures protruding from the substrate.

16. The method according to claim 7, wherein:
the N-type region dummy gate structure is connected with the second dummy gate structure through the first dummy gate structure.

17. The method according to claim 7, wherein:
along a direction parallel to a surface of the base substrate, a cross section of the N-type region dummy gate structure, the first dummy gate structure, and the second dummy gate structure has a cross shape.

* * * * *